(12) United States Patent  
Lai et al.

(10) Patent No.: US 11,020,837 B2  
(45) Date of Patent: Jun. 1, 2021

(54) MONOLITHIC PLATEN

(71) Applicant: Taiwan Semiconductor Manufacturing Co., Ltd., Hsinchu (TW)

(72) Inventors: Tsung-Lung Lai, Hsinchu (TW); Cheng-Ping Chen, Taichung (TW); Shih-Chung Chen, Hsinchu (TW); Sheng-Tai Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/965,685

(22) Filed: Apr. 27, 2018

(65) Prior Publication Data

US 2019/0143478 A1     May 16, 2019

Related U.S. Application Data

(60) Provisional application No. 62/585,735, filed on Nov. 14, 2017.

(51) Int. Cl.
*B24B 37/30* (2012.01)
*B24B 37/04* (2012.01)
*H01L 21/67* (2006.01)
*H01L 21/306* (2006.01)
*H01L 21/677* (2006.01)

(52) U.S. Cl.
CPC ............ *B24B 37/30* (2013.01); *B24B 37/042* (2013.01); *H01L 21/30625* (2013.01); *H01L 21/67075* (2013.01); *H01L 21/67092* (2013.01); *H01L 21/67219* (2013.01); *H01L 21/67253* (2013.01); *H01L 21/67742* (2013.01)

(58) Field of Classification Search
None
See application file for complete search history.

(56) References Cited

U.S. PATENT DOCUMENTS

| | | | | |
|---|---|---|---|---|
| 5,975,991 A * | 11/1999 | Karlsrud | ............... | B24B 37/345 451/287 |
| 6,056,631 A * | 5/2000 | Brown | ................ | B24B 27/0076 451/288 |
| 6,152,806 A * | 11/2000 | Nystrom | ............... | B24B 37/042 451/287 |
| 9,138,860 B2 * | 9/2015 | Dhandapani | .......... | B24B 53/017 |
| 2004/0033759 A1 * | 2/2004 | Schultz | ................ | B24B 37/205 451/6 |
| 2011/0256812 A1 | 10/2011 | Dhandapani et al. | | |
| 2019/0143478 A1 * | 5/2019 | Lia | .......................... | B24B 37/30 |

* cited by examiner

*Primary Examiner* — Sylvia Macarthur
(74) *Attorney, Agent, or Firm* — Duane Morris LLP

(57) ABSTRACT

In an embodiment, a chemical mechanical planarization (CMP) system includes: a monolithic platen within a platen housing, wherein the monolithic platen is formed of a single piece of material, wherein the monolithic platen includes: a first portion within a first opening, and a second portion within a second opening, wherein the first portion has a different diameter than the second portion; and a polishing fluid delivery module above the monolithic platen, wherein the polishing fluid delivery module is configured to deliver slurry to the monolithic platen during performance of CMP.

20 Claims, 6 Drawing Sheets

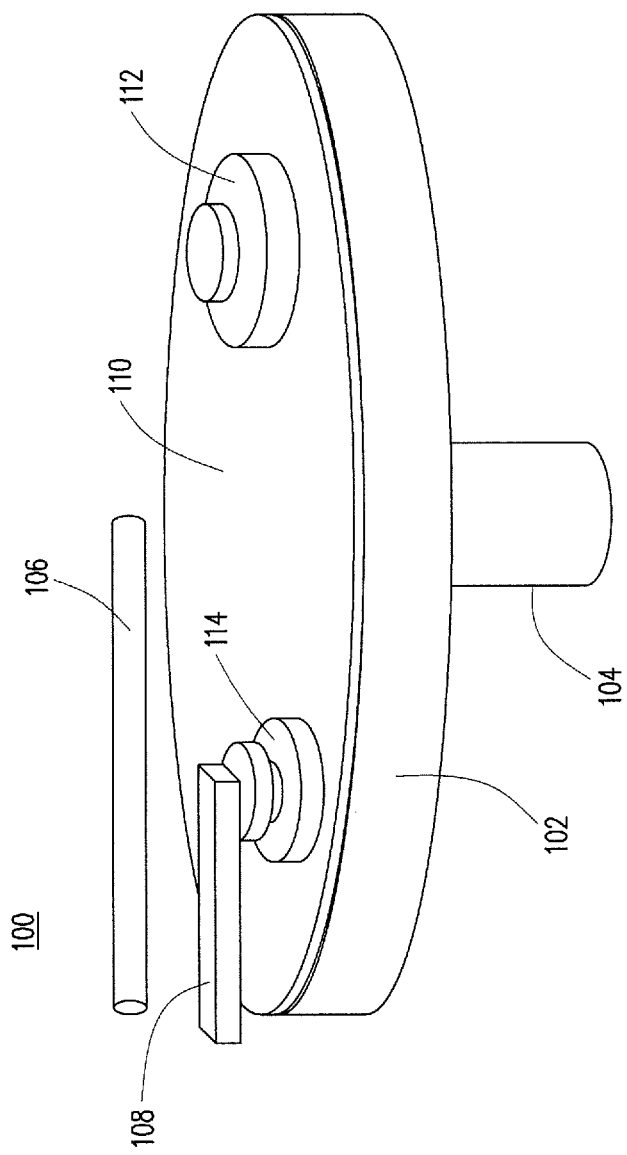

MONOLITHIC PLATEN

RELATED APPLICATIONS

This application claims priority to U.S. Provisional Application No. 62/585,735 entitled "MONOLITHIC PLATEN" filed on Nov. 14, 2017, the contents of which is incorporated by reference herein in its entirety.

BACKGROUND

Integrated circuits are typically comprised of a plurality of semiconductor devices formed in or on a substrate. In current applications, integrated circuits can consist of literally thousands or millions of individual semiconductor devices formed in or on the substrate. Typically, large numbers of integrated circuits are formed on a single wafer by selectively exposing regions of the wafer so as to allow for deposition of materials or implantation of impurities into a semiconductor wafer to thereby alter the characteristics of the wafer to produce the desired different semiconductor devices. The semiconductor devices can be formed in the exposed regions of the wafer using well-known masking techniques in conjunction with well-known diffusion, implantation or deposition techniques.

Semiconductor device fabrication techniques have been developed which allow for a higher density of semiconductor devices to be formed in the integrated circuit. As the scale of integration has increased and as the size of the individual semiconductor devices has decreased, it has become more important that integrated circuit designers and fabricators consider the structural integrity of the deposited devices and of the integrated circuit as a whole.

Repeated deposition of materials into the exposed regions of the wafer can result in the integrated circuit having a non-planar upper surface. As the upper surface of the integrated device becomes less planar, the ability to form additional semiconductor devices on the integrated circuit becomes more difficult. Moreover, the existence of protrusions in the topography of the integrated circuit affects the structural integrity of the circuit and can result in failure of the device. Consequently, integrated circuit designers and fabricators have increasingly used planarization techniques to planarize the upper surface of the integrated circuits during fabrication.

One particular planarization technique is known as chemical mechanical polishing or planarization (CMP). CMP is a technique whereby the upper surface of a wafer is globally planarized by simultaneously abrasively polishing and etching the upper surface of the wafer. Basically, the wafer is positioned adjacent a pad that is moved with respect to the wafer and the pad, and a slurry which is typically comprised of an etchant liquid. An abrasive encapsulated within a suspension fluid may be introduced. The pad is then applied to the wafer so that protrusions in the surface topography of the integrated circuits on the wafer can be removed by a combination of abrasive polishing and etching to thereby planarize and polish the upper surface of the wafer.

However, as CMP processes become increasingly commonplace, cost effective off the shelf CMP systems that perform CMP have become increasingly commonplace and include various sensors and apparatuses that may monitor process parameters and other aspects of the CMP process. For example, various off the shelf systems may feature sensors embedded in a platen assembly (e.g., multi piece platen) used in CMP. However, some of these various sensors may be unnecessary and unduly complicate the CMP process despite being part of off the shelf CMP systems. Therefore, there is a need for improved methods and apparatus for CMP.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 1 is a perspective view of a polishing station with a monolithic platen, in accordance with some embodiments.

DETAILED DESCRIPTION OF EXEMPLARY EMBODIMENTS

Figure 2A:
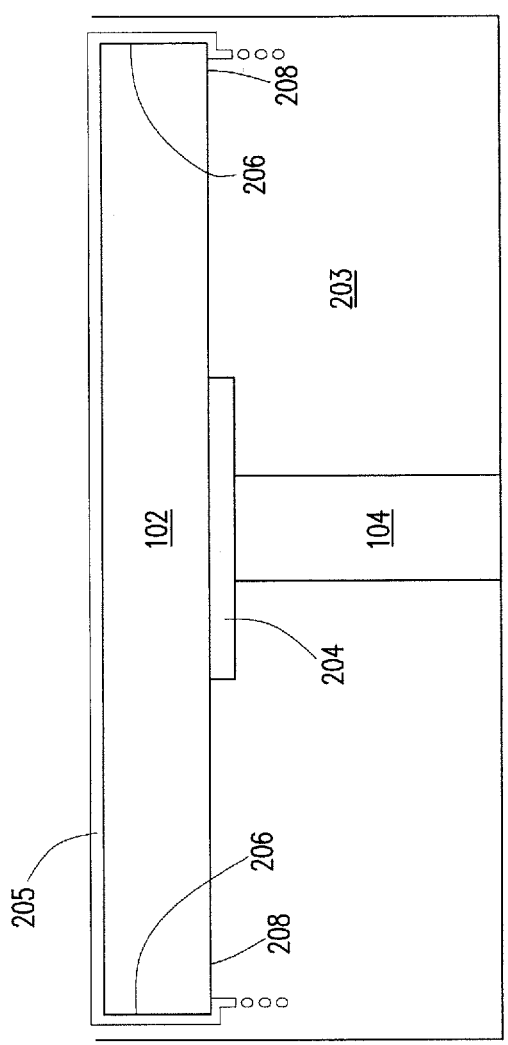
FIG. 2A is a side view of the monolithic platen of FIG. 1, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a monolithic platen for chemical mechanical polishing or planarization (CMP). A monolithic platen may be a platen formed of a single monolithic piece. A platen may be a flat surface on which CMP is performed. The monolithic platen may be made of a single or a combination (e.g., a mixture) of materials but is formed as one piece. A monolithic platen may be contrasted with a platen assembly, which is a platen of multiple pieces that is mechanically assembled and is not a single monolithic piece of material (and thus not formed as one piece). For example, a platen assembly may include an upper platen on top of a lower platen that may be mechanically adhered (e.g., attached) together.

By being a single monolithic piece of material, the monolithic platen may be without weak points (e.g., points sealed mechanically with an O-ring or secured with pins or pin holes) from which damaging mediums (e.g., slurry and/or deionized water (DIW)) may seep into the interior of the monolithic platen and damage the platen over the course of platen use (e.g., due to wear and tear). For example, a monolithic platen may not have an interior for which damaging mediums may enter. In contrast, platen assemblies may have such weak points (and/or an interior) from which they receive damage over the course of platen use.

As introduced above, cost effective off the shelf CMP systems that perform CMP have become increasingly feature rich by including various sensors and apparatuses that may monitor process parameters and other aspects of the CMP process. By being off the shelf, such a CMP system may be readily commercially available and/or offered with a standard set of various sensors and apparatuses. Examples of such off the shelf CMP systems may include the Reflexion GT™ system, REFLEXION® LK CMP system, and MIRRA MESA® system sold by Applied Materials, Inc., of Santa Clara, Calif., USA. Examples of such sensors and apparatuses include an end point detector that may detect the amount of CMP planarization (e.g., thinness of the wafer undergoing CMP). An end point detector may include a laser module from which laser reflections off of a wafer may be monitored to determine the amount of CMP planarization. It has become increasingly common for such sensors and apparatuses to be included within a platen, such as a laser module or an end point detector within the platen to monitor a wafer undergoing CMP above the platen. Platens that include such sensors or apparatuses may be a platen assembly, discussed above, formed of multiple pieces (e.g., upper platen and a lower platen) to include the embedded sensor or apparatus. These multiple pieces may be mechanically adhered together in order to encapsulate the embedded sensors or apparatuses in a platen assembly. Also, by having sensors or apparatuses in a platen assembly, the platen assembly may have an opening (e.g., an opening along a top surface of a platen assembly, or along an upper platen) for which the sensor may monitor a wafer undergoing CMP.

However, as discussed above, platen assemblies may include weak points or interiors that are susceptible to damaging mediums, which may be exacerbated by prolonged use. Furthermore, platen assemblies may be especially susceptible to damaging mediums relative to monolithic platens as a platen is typically moved (e.g., rotated) during CMP processes, with pressure (e.g., a downward pressure) applied to an upper surface of the platen. For example, shear pressures may be more present in platen assemblies (than monolithic platens) due to a pressure differential between an upper platen that receives downward pressure and a lower platen that contacts the upper platen while being moved during CMP processes. Furthermore, platens (e.g., a platen assembly or a monolithic platen) experience relatively more wear and abrasion during CMP than other components of a CMP system as damaging mediums (e.g., slurry or deionized water) may be spread along the edges and surfaces of a platen and travel along the sides (e.g., coating at least a portion of the sidewalls) of the platen to drip off of a platen edge (e.g., along the side of a platen). Over time, this exposure to such damaging mediums may erode a platen, for example by entering the weak points of a platen assembly.

However, such off the shelf CMP systems may be cost effective due to being produced at an economy of scale with standard features. Furthermore, the various sensors and apparatuses on conventional CMP systems (e.g., off the shelf CMP systems) may be utilized in certain applications. However, there may be applications that do not utilize all of the various sensors and apparatus for such conventional CMP systems, such as the various sensors and apparatuses that may be embedded in a platen assembly and/or that would require use of a platen assembly. Accordingly, it may be desirable to utilize such off the shelf CMP systems but to substitute unnecessary or undesirable parts from such off the shelf CMP systems. For example, a platen assembly may not be desirable for certain applications and may be substituted with a monolithic platen while preserving the remainder of the off the shelf CMP system, in accordance with various embodiments.

Furthermore, monolithic platens may be designed to facilitate interchange with platen assemblies. For example, as will be discussed further below, monolithic platens may be constructed with a form factor and configured for reception within a platen housing designed for a platen assembly. In certain embodiments, monolithic platens and platen assemblies may have at least one inside corner along a side of the monolithic platen to facilitate reception within a platen housing designed for platen assembly. An inside corner may be a corner formed by two intersecting surfaces at an angle measured from the outside (e.g., external to the monolithic platen or within an opening of the platen housing) of less than 180 degrees. In certain embodiments, an inside corner may be at a right angle. In various embodiments, the inside corner may be a tapered sidewall. In further embodiments, there may be multipole inside corners, such as two or more inside corners.

Also, CMP systems may be adapted to substitute a platen assembly for a monolithic platen by making according changes to the operation for the CMP system (e.g., by configuring a controller, discussed further below). For example CMP systems may be adapted to substitute a platen assembly for a monolithic platen by turning off or ignoring controller operations for sensors or apparatuses that would require a platen assembly.

Furthermore, utilization of monolithic platens (e.g., by replacing platen assemblies with monolithic platens) resolves a long felt but unresolved need in semiconductor processing. Conventional platen assemblies in off the shelf CMP systems have suffered from rapid degradation. These degraded conventional platen are typically replaced in an off the shelf CMP system at significant expense (e.g., production and maintenance costs). This may result in undesirable extended downtimes for conventional (e.g., off the shelf) CMP systems. However, a monolithic platen may improve the working life of a platen by, for example, from about 200 hours to about 400 hours per year when compared to a conventional platen assembly. Thus, semiconductor device production and maintenance costs can be significantly reduced.

FIG. 1 is a perspective view of a polishing station 100 with a monolithic platen 102, in accordance with some embodiments. The monolithic platen 102 may be supported and rotated via a rotary rod 104. A platen (whether the monolithic platen 102 or a platen assembly) may be rotated during operation (e.g., polishing) using the rotary rod 104. The polishing station 100 may be part of an off the shelf CMP system that is modified to have a platen assembly (e.g., the platen that came with the original off the shelf CMP system formed of multiple pieces) replaced with the monolithic platen 102 (e.g., a platen formed of one piece that does not come with the original off the shelf CMP system).

The polishing station 100 may also have a polishing fluid delivery module (e.g., slurry) 106, pad conditioner module 108, polishing pad 110, and a carrier head 112. These parts of the polishing station 100 may be original to the off the shelf CMP system and not replaced in the manner that the monolithic platen 102 replaces a platen assembly. The polishing pad 110 may have a polishing surface capable of polishing one or multiple wafers (e.g., substrates) at a same time and a matching number of polishing units for each of the wafers Each of the polishing units may include one or more carrier heads 112, a pad conditioner module 108 and a polishing fluid delivery module 106. In one embodiment, the polishing fluid delivery module 134 may comprise a slurry delivery arm. The polishing pad 110 may be supported on the monolithic platen 102 which rotates the polishing pad 110 during processing. In one embodiment, the polishing surface of the polishing pad is suitable for CMP (e.g., by performing a chemical mechanical polishing and/or an electrochemical mechanical polishing process).

The polishing station 100 is adapted to position the pad conditioner module 108 and the carrier head 112 in contact with the polishing surface (e.g., upper surface) of the polishing pad 110, and further is adapted to provide a relative motion therebetween. The carrier head 112 may physically move a wafer and transfer a polishing force (e.g., downward force) to the wafer, sandwiching the wafer between the carrier head 112 and the polishing pad 110. The pad conditioner module 108 has a distal end coupled to the polishing pad (via the conditioning head 114 of the pad conditioner module 108) and a proximal end coupled to a base (not illustrated) that also supports the rotary rod 104. The conditioning head 114 may be swept across the polishing surface of the polishing pad 110 to condition the polishing surface.

Damaging mediums, such as a slurry and/or deionized water, may be provided by the polishing fluid delivery module 106 as a chemical to facilitate polishing using the above referenced mechanical processes (e.g., mechanical force between the polishing pad 110 and the carrier head 112) during the CMP process. The slurry may be abrasive and corrosive and may degrade the materials that it contacts, especially after repeat exposures. The deionized water may be utilized to dilute and/or clean the polishing station 100 (e.g., by transporting used slurry away from the polishing station 100). A platen assembly may be more vulnerable to abrasion and corrosion than a monolithic platen due to the presence of weak points, as discussed above. Accordingly, the polishing station 100 of the off the shelf CMP system may desirably experience prolonged operational life by substituting the monolithic platen 102 to replace a platen assembly that may come initially installed in the polishing station 100.

FIG. 2A is a side view 200 of the monolithic platen 102 of FIG. 1, in accordance with some embodiments. The monolithic platen 102 may be disposed within a platen housing 203 of the polishing station 100. The platen housing 203 may be a space where a platen may rest and be operated. Specifically, the platen housing 203 may be a space configured to receive a platen assembly of the off the shelf CMP system, but also where the monolithic platen 102 may rest and be operated as a replacement for the platen assembly. In some embodiments, the monolithic platen 102 is secured to the rotary rod 104 via a bearing 204. Also, as introduced above, damaging mediums 205 such as a slurry and/or deionized water may be applied to the polishing surface (e.g., upper surface) of the polishing pad 110 and/or the upper surface of the monolithic platen 102. Furthermore, during CMP or other operations of the monolithic platen 102, such damaging mediums may flow off of the monolithic platen 102 along the sides 206 (e.g., sidewalls) of the monolithic platen and/or along the sides 206 (e.g., sidewalls) and the bottom 208 of the monolithic platen. Typically, weak points of a platen assembly may be disposed along the sides of the platen assembly (e.g., at the interface between an upper platen and a lower platen). As one example, weak points may be at an inside corner of the platen assembly where an upper platen and a lower platen meet. Also, weak points may be along the upper surface of the platen assembly (e.g., as holes or openings for sensors or other apparatuses within a platen assembly). These weak points may degrade over time (e.g., due to shear stress between the upper and lower platen, or decay of the materials at the weak points) such that the damaging mediums may enter the platen assembly at the weak points and cause internal damage to the platen assembly.

However, such internal damage or exposure of the damaging mediums to the inside of a platen assembly may be avoided by replacing the platen assembly with a monolithic platen. In contrast with a platen assembly, a monolithic platen may not have any, or at least fewer, weak points or internal surfaces or cavities. This may be due to the monolithic platen being formed of a single piece (in contrast to the multiple pieces of a platen assembly). Stated another way, the monolithic platen is be solid within (e.g., without any cavities or openings).

Figure 2B:
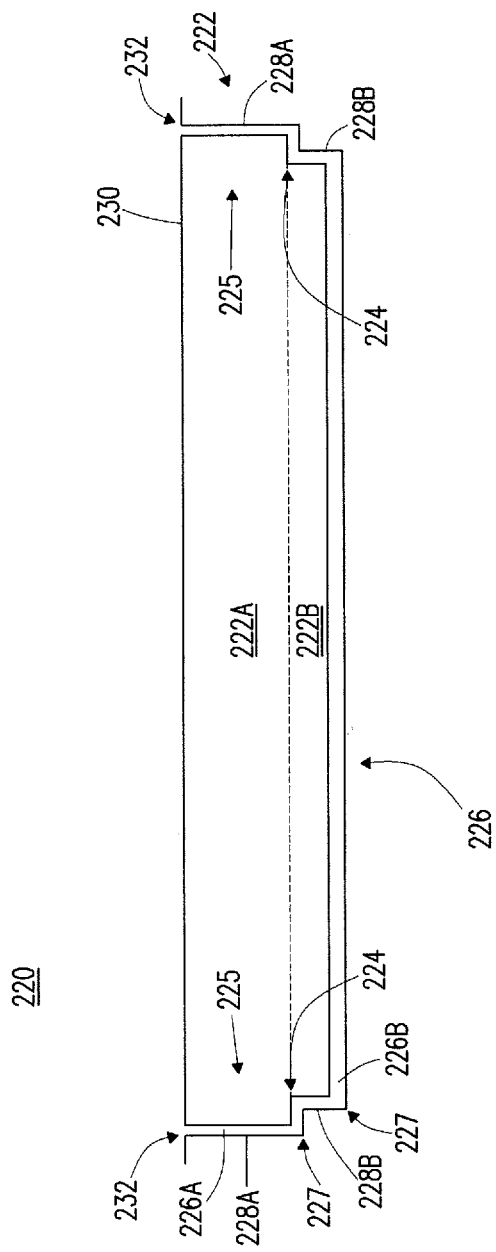
FIG. 2B is a side view of a polishing station with a monolithic platen of a platen assembly form factor, in accordance with some embodiments.

FIG. 2B is a side view of a polishing station 220 with a monolithic platen 222 of a platen assembly form factor, in accordance with some embodiments. The polishing station 220 may include many of the components the above discussed polishing stations, which will not be repeated here for brevity. This platen assembly form factor monolithic platen 222 may be designed to have a form factor (e.g., external shape or contour) that mirrors a platen assembly, but be formed as a single piece, rather than multiple pieces. In certain embodiments, a platen assembly form factor may describe a monolithic platen with at least one inside corner 224 along a side, which may mirror an interface between surfaces of different platens of the platen assembly. As discussed above, an inside corner may be a corner formed by two intersecting surfaces of the monolithic platen at an angle measured from the outside of the monolithic platen of less than 180 degrees. For example, the inside corner may be any of 30 degrees, 45 degrees, 60 degrees, 90 degrees, 120 degrees, 135 degrees, or 140 degrees. In certain embodiments, the inside corner may be greater than 90 degrees so that the inside corner may be more open than closed and easier to clean due to less accumulation of debris (e.g., dust or residue) within the inside corner. Furthermore, the inside corner may be tapered such that the corner forms a curve that relates two surfaces together at less than 180 degrees (e.g., where respective tangent lines of the two surfaces are less than 180 degrees apart). Also, the platen assembly form factor monolithic platen 222 may include an upper platen part 222A (e.g., first portion) and a lower platen part 222B (e.g., second portion), as delineated with dotted lines. These different parts (e.g., the upper platen part 222A and the lower platen part 222B) may intersect at the inside corner 224 along the side 225 and experience different shear forces.

However, in contrast with a platen assembly that has an upper platen and a lower platen as different pieces that may be adhered together (mechanically assembled or combined), this upper platen part 222A and lower platen part 222B may be a contour of the platen assembly form factor monolithic platen 222 that is formed of a single piece. In certain embodiments, the thickness of the different platen parts may be related to each other. For example, a ratio of thickness between the upper platen part 222A and the lower platen part 222B may be 1:1, 1:2, 1:3, 1:4, 1:5, 1:6, 1:7, 1:8, 1:9, or 1:10. In certain embodiments, the ratio of thickness between the upper platen part 222A and the lower platen part 222B may be less than 1:5 (e.g., 1:6 or less) so as to reduce the effect of shear forces at an inside angle from the differently sized upper and lower platen parts. Also, the inside corner 224 may not necessarily be at a 90 degree angel in certain embodiments.

Stated another way, the platen assembly form factor monolithic platen 222 may be formed of a single piece, but may include side contours (e.g., at least one inside corner along the side) similar to or that mirror a platen assembly. Also, by being formed of a single piece, the platen assembly form factor monolithic platen 222 may have a continuously non-concave surface. This may contrast with a platen assembly that is not formed as a single piece. For example, a platen assembly may have a concavity (e.g., a hole) in which a sensor may be disposed Also, a platen assembly may be non-continuous (e.g., by being formed of more than one piece, with a critical boundary where the surface of one piece ends and the surface of another piece begins).

Accordingly, by mirroring the form factor of a platen assembly, a platen assembly form factor monolithic platen 222 may fit into a platen housing 226 designed to receive a platen assembly. This platen housing 226 may have at least one inside corner along its side opposite the side of a monolithic platen. For example, the platen housing 226 may have two inside corners 227 along its side opposite to the side 225 of the monolithic platen 222 in order to mate with the at least one inside corner of the monolithic platen 222.

Also, the platen housing 226 may have a first opening 226A and a second opening 226B that is continuous with (e.g., is within the bounds of) the first opening 226A. The first opening 226A may have a first diameter between sidewalls 228A of the first opening 226A that is larger than a second diameter between sidewalls 228B of the second opening 226B. Stated another way, the second opening 226B is continuous with the first opening 226A as the second opening 226B is within the first diameter of the first opening 226A. The sidewalls 228A and 228B opposite the sides 225 of the monolithic platen 222, and transitions between the sidewalls 222A and 228B (e.g., inside corners), may be a contour of the platen housing 226. This contour of the platen housing 226 may form an inside corner 227. Although two openings are discussed above, a platen housing 226 may have any number of openings (e.g., three or more) that may conform to (e.g., have a mirroring contour with) a side 225 surface of a monolithic platen as desired in accordance with different applications in various embodiments.

Furthermore, although the platen assembly form factor monolithic platen 222 may have a form factor of a platen assembly, it may not have the weak points of a platen assembly, such as a weak point at an interface (e.g., corresponding to the inside corner 224) between where an upper platen and a lower platen of a platen assembly would meet (e.g., as a seal or an O-ring between the upper platen and lower platen of a platen assembly). Accordingly, none of the inside corners 224 of the monolithic platen 222 along a side 225 of the monolithic platen 222 may be at an interface between different pieces or materials. This may be due to the monolithic platen being formed of a single piece. This may be contrasted with a platen assembly, where at least one of the inside corners along a side of a platen assembly may be an interface between different pieces or materials (e.g., between an upper platen and a lower platen).

As discussed above, the polishing station 220 may include a platen housing 226 structured to receive a platen assembly (e.g., by having at least two openings). Accordingly, a platen assembly form factor monolithic platen 222 may fit into a platen housing more easily if structured with a form factor that mirrors a form factor of a platen assembly. Also, the platen assembly form factor monolithic platen 222 may have an upper surface 230 that is aligned with (e.g., at a same level as) an upper edge 232 of the platen housing.

Figure 2C:
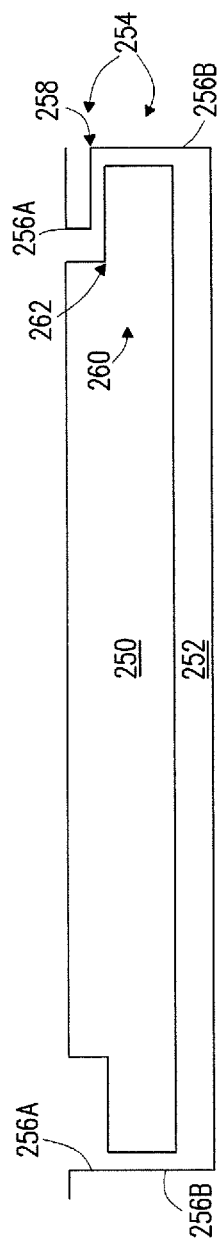
FIG. 2C is a side view of a monolithic platen with a platen assembly form factor for a specific platen housing, in accordance with some embodiments.

FIG. 2C is a side view of a monolithic platen 250 with a platen assembly form factor for a specific platen housing 252, in accordance with some embodiments. As discussed above, a platen assembly (that the monolithic platen 250 may replace) may possesses a unique form factor in order to fit into the specific platen housing 252 configured to receive the platen assembly (similar to how a key may fit into a keyhole). Accordingly, monolithic platen 250 have a platen assembly form factor that mirrors a platen assembly to fit into the specific platen housing 252. This mirroring may be more desirable the more unique the specific platen housing 252 is. For example, the specific platen housing 252 may have a groove or contour 254 for which the platen assembly form factor monolithic platen 250 may conform to in order to fit inside of the specific platen housing 252. This contour 254 may include the different sidewalls 256A and 256B of the specific platen housing 252. As part of the specific platen housing 252, the diameter between the first sidewalls 256A may delineate an upper opening and the diameter between the second sidewalls 256B may delineate a second opening. The upper opening may have a smaller diameter than the lower opening. Also, this contour 254 of the platen housing may include at least one inside corner 258 opposite the side 260 of the monolithic platen 250. Accordingly, the side 260 of the monolithic platen 250 may also have an inside corner 262.

Figure 3:
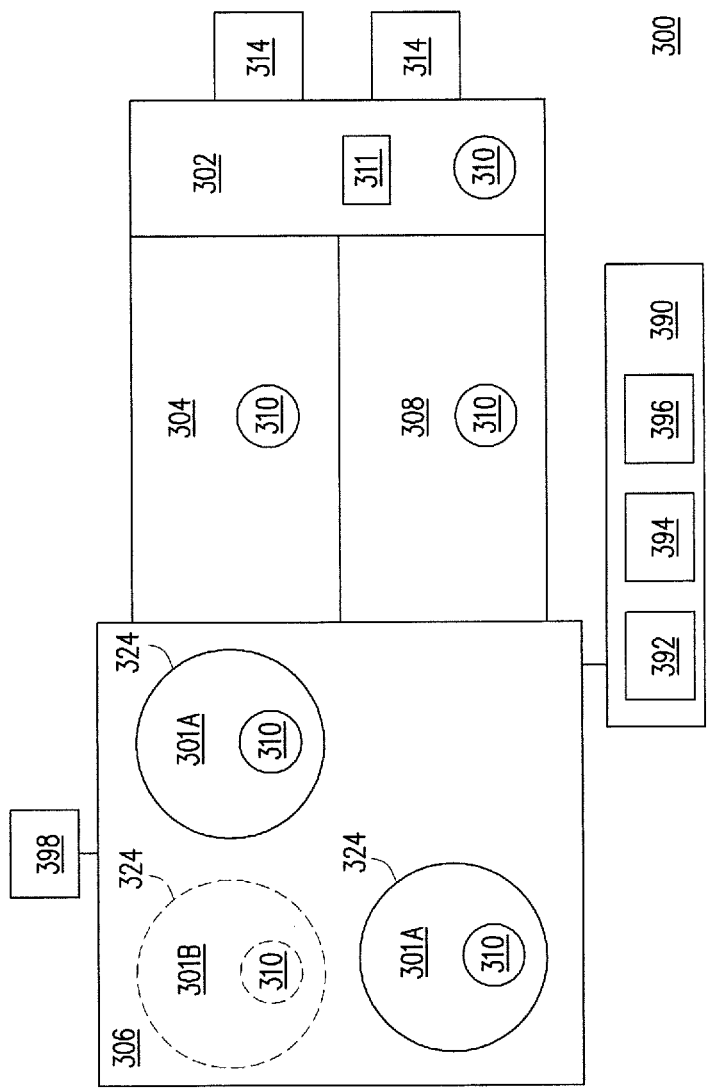
FIG. 3 is an illustration of a polishing station with monolithic-platens and, optionally, platen assemblies in a chemical mechanical polishing or planarization system, in accordance with some embodiments.

FIG. 3 is an illustration of polishing stations with monolithic platens and, optionally, platen assemblies in a chemical mechanical polishing or planarization (CMP) system 300, in accordance with some embodiments. This CMP system 300 may utilize monolithic platens 301A exclusively or may utilize both monolithic platens 301A and platen assemblies 301B. Various aspects of the CMP system will be discussed below.

The CMP system 300 may include a transfer platform 302, a cleaner 304 and a polishing station 306. A wet robot module 308 may be provided to transfer wafers (e.g., substrates) 310 between the transfer platform 302 and the polishing station 306. The wet robot module 308 may also be configured to transfer wafers between the polishing station 306 and the cleaner 304. The transfer platform 302 includes a dry robot 311 which is configured to transfer wafers 310 between one or more cassettes 314 and one or more transfer platforms 302. The dry robot 311 is configured to receive wafers from the cleaner 304 and return the clean polished wafers to the wafers storage cassettes 314. In certain embodiments, reference to a CMP system may only refer to the polishing station 306 exclusively (e.g., exclusive of the transfer platform 302, cleaner 304, wet robot module 308, or cassettes 314).

The polishing station 306 includes a plurality of polishing stations 324 with monolithic platens 301A or platen assemblies 301B on which wafers or substrates are polished. The polishing stations 324 are sized to interface with a carriage (not shown) that is mounted to an overhead track. The overhead track allows the carriage to be selectively positioned around the polishing station 306.

In certain embodiments, two polishing stations 324 with monolithic platens 301A are shown located in opposite corners of the polishing station 306. Optionally, a third polishing station 324 (shown in phantom) may be positioned in a corner of the polishing station 324. This third polishing station 324 (shown in phantom) may include a platen assembly 301B. Additional polishing stations 324 with a monolithic platen or a platen assembly may be integrated in the polishing station 306 in CMP systems having a larger footprint.

To facilitate control of the CMP system 300 and processes performed thereon, a controller 390 comprising a central processing unit (CPU) 392, memory 394, and support circuits 396, is connected to the CMP system 300. The CPU 392 may be one of any form of computer processor that can be used in an industrial setting for controlling various drives and pressures. The memory 394 is connected to the CPU 392. The memory 394, or computer-readable medium, may be one or more of readily available memory such as random access memory (RAM), read only memory (ROM), floppy disk, hard disk, or any other form of digital storage, local or remote. The support circuits 396 are connected to the CPU 392 for supporting the processor in a conventional manner. These circuits include cache, power supplies, clock circuits, input/output circuitry, subsystems, and the like. Also, the CMP system may include a power source 398.

As discussed above, the CMP system 300 may be complicated with many components. To avoid redesigning and reconstructing an entire CMP system (and to rely rather on more cost effective off the shelf components), a monolithic platen may be utilized in lieu of a platen assembly while retaining much of an off the shelf CMP system. Such a CMP system 300 may solve the problems associated with a platen assembly (e.g., weak points and unnecessary sensors and apparatuses internal to a platen assembly, as discussed above) while remaining cost effective and easy to use due to the integration of off the shelf components.

Figure 4:
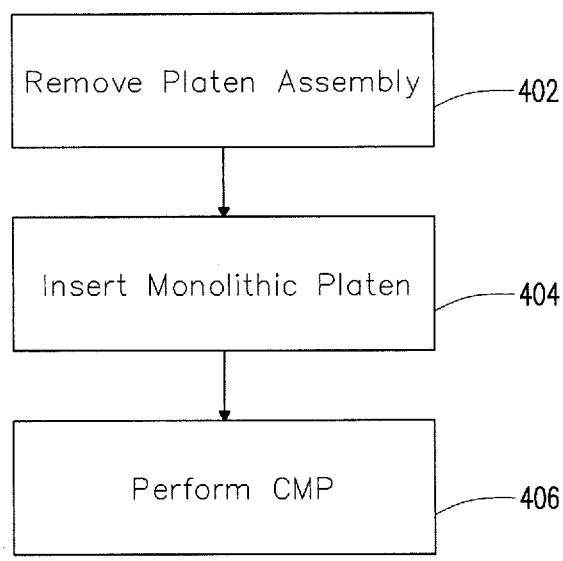
FIG. 4 is a flow chart of a chemical mechanical polishing or planarization process using a monolithic platen, in accordance with some embodiments.

FIG. 4 is a flow chart of a CMP process 400 with a monolithic platen, in accordance with some embodiments. The CMP process 400 with a monolithic platen may be performed by a CMP system 300, as discussed above in connection with FIG. 3. It is noted that the process 400 is merely an example, and is not intended to limit the present disclosure. Accordingly, it is understood that additional operations may be provided before, during, and after the process 400 of FIG. 4, certain operations may be omitted, certain operations may be performed concurrently with other operations, and that some other operations may only be briefly described herein.

The method illustrated in the process 400 may solve the problems associated with a platen assembly (e.g., weak points and unnecessary sensors and apparatuses internal to a platen assembly, as discussed above) while remaining cost effective and easy to use due to the integration of off the shelf components. At block 402, a platen assembly may be removed from a platen housing of an off the shelf CMP system. At block 404, the platen housing may receive a monolithic platen that conforms (e.g., fits) within the contours of the platen housing. Accordingly, the monolithic platen may replace the platen assembly in the platen housing. At block 406, CMP (discussed further above) may be performed using the monolithic platen.

In an embodiment, a chemical mechanical planarization (CMP) system includes: a monolithic platen within a platen housing, wherein the monolithic platen is formed of a single piece of material, wherein the monolithic platen includes: a first portion within a first opening, and a second portion within a second opening, wherein the first portion has a different diameter than the second portion; and a polishing fluid delivery module above the monolithic platen, wherein the polishing fluid delivery module is configured to deliver slurry to the monolithic platen during performance of CMP.

In another embodiment, a chemical mechanical planarization (CMP) system includes: a platen housing including: a first opening including a first diameter, and a second opening continuous with the first opening, the second opening including a second diameter different than the first diameter; a platen within the platen housing, wherein the platen is formed of a single piece with a continuously non-concave surface, wherein the platen includes: a first portion within the first opening, and a second portion within the second opening, wherein the first and second portions have different diameters.

In another embodiment, a method for performing chemical mechanical planarization (CMP) includes: removing a platen assembly from a platen housing, wherein the platen housing includes: a first opening including a first diameter, and a second opening continuous with the first opening, the second opening including a second diameter different than the first diameter, wherein the platen assembly includes an upper platen that conforms with the first opening and a lower platen that conforms with the second opening; inserting a monolithic platen into the platen housing, wherein the monolithic platen is formed as one piece, wherein the monolithic platen comprises: a first portion within the first opening, and a second portion within the second opening, wherein the first and second portions have different diameters.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A chemical mechanical planarization (CMP) system, comprising:
   a monolithic platen within a first platen housing, wherein the monolithic platen is formed of a single piece of material with a continuously non-concave top surface having no holes therein, wherein the monolithic platen comprises:
      a first portion within a first opening of the first platen housing, and
      a second portion within a second opening of the first platen housing, wherein the first portion has a different diameter than the second portion, and wherein the first and second portions form the single piece of material such that no interface exists between the first and second portions; and
   a polishing fluid delivery conduit disposed above the monolithic platen, wherein the polishing fluid delivery conduit is configured to deliver slurry to the monolithic platen during performance of CMP.

2. The system of claim 1, wherein:
   the first opening comprises a first diameter, and
   the second opening is continuous with the first opening, wherein the second opening comprises a second diameter different than the first diameter.

3. The system of claim 2, further comprising:
   a polishing station comprising the first platen housing; and
   a cleaner.

4. The system of claim 2, wherein an upper edge of the first platen housing is aligned with an upper surface of the monolithic platen.

5. The system of claim 2, wherein the monolithic platen comprises one inside corner and the first platen housing comprises two inside corners.

6. The system of claim 2, further comprising:
   a second platen housing comprising:
      a third opening comprising the first diameter, and
      a fourth opening continuous with the third opening, the fourth opening comprising the second diameter;
   a platen assembly within the second platen housing, wherein the platen assembly comprises:
      an upper platen within the third opening, and
      a lower platen below the upper platen within the fourth opening, wherein the upper platen and the lower platen have different diameters and are formed from two separate pieces.

7. The system of claim 6, further comprising:
   a polishing station comprising the first platen housing and the second platen housing; and
   a robot configured to move a wafer to either the first platen housing or the second platen housing.

8. The system of claim 6, further comprising a controller configured to control operation of the system.

9. The system of claim 6, wherein a form factor of the platen assembly is the same as a form factor of the monolithic platen.

10. A chemical mechanical planarization (CMP) system, comprising:
    a platen housing comprising:
       a first opening comprising a first diameter, and
       a second opening continuous with the first opening, the second opening comprising a second diameter different than the first diameter;
    a platen within the platen housing, wherein the platen is formed of a single piece of material with a continuously non-concave top surface having no holes therein, wherein the platen comprises:
       a first portion within the first opening, and
       a second portion within the second opening, wherein the first and second portions have different diameters, and wherein the first and second portions form the single piece of material such that no interface exists between the first and second portions.

11. The system of claim 10, wherein the first diameter is larger than the second diameter.

12. The system of claim 10, wherein the platen is free of a laser module within the platen.

13. The system of claim 10, wherein the first portion and the second portion experience different shear forces during chemical mechanical planarization.

14. The system of claim 10, wherein the platen is formed of a single material and is solid within.

15. A chemical mechanical planarization (CMP) system, comprising:
    a monolithic platen within a first platen housing, wherein the monolithic platen is formed of a single piece of material with a continuously non-concave top surface having no holes therein, wherein the monolithic platen comprises:
       a first portion within a first opening of the first platen housing, and
       a second portion within a second opening of the first platen housing, wherein the first portion has a different diameter than the second portion, and wherein the first and second portions form the single piece of material such that no interface exists between the first and second portions;
    a polishing fluid delivery conduit above the monolithic platen, wherein the polishing fluid delivery conduit is configured to deliver slurry to the monolithic platen during performance of CMP; and
    a platen assembly within a second platen housing, wherein the platen assembly comprises:
       an upper platen within a third opening of the second platen housing, and
       a lower platen below the upper platen and within the a fourth opening of the second platen housing, wherein the upper platen and the lower platen have different diameters and are formed from two separate pieces.

16. The system of claim 15, wherein:
    the first and third openings have a first diameter, and
    the second opening is continuous with the first opening and the fourth opening is continuous with the third opening, wherein the second and fourth openings have a second diameter different than the first diameter.

17. The system of claim 16, wherein an upper edge of the first platen housing is aligned with an upper surface of the monolithic platen.

18. The system of claim 15, wherein the monolithic platen comprises one inside corner and the first platen housing comprises two inside corners.

19. The system of claim 15, further comprising:
   a polishing station comprising the first platen housing and the second platen housing; and
   a robot configured to move a wafer to either the first platen housing or the second platen housing.

20. The system of claim 15, wherein a form factor of the platen assembly is the same as a form factor of the monolithic platen.

* * * * *